United States Patent [19]

Klein

[11] Patent Number: 4,464,544
[45] Date of Patent: Aug. 7, 1984

[54] CORONA-EFFECT SOUND EMITTER

[76] Inventor: Siegfried Klein, 42 rue de La Tour-d'Auvegne, F-75009 Paris, France

[21] Appl. No.: 401,323

[22] Filed: Jul. 23, 1982

Related U.S. Application Data

[63] Continuation-in-part of Ser. No. 132,231, Mar. 31, 1980, abandoned.

[30] Foreign Application Priority Data

Apr. 13, 1979 [FR] France ................... 79 09448

[51] Int. Cl.³ ...................... H04R 23/00; H01F 27/30
[52] U.S. Cl. ................................ 179/113; 179/114 R; 336/84 C; 336/DIG. 2
[58] Field of Search ................ 179/113, 101, 114 R; 336/84 C, DIG. 2; 367/142

[56] References Cited

U.S. PATENT DOCUMENTS

| | | | |
|---|---|---|---|
| 1,751,888 | 3/1930 | Ruben | 179/113 |
| 1,758,993 | 5/1930 | Wolff | 179/113 |
| 2,265,475 | 12/1941 | Fodor | 336/DIG. 2 |
| 2,533,920 | 12/1950 | Crook | 336/84 C |
| 2,768,246 | 10/1956 | Klein | 179/113 |
| 3,177,288 | 4/1965 | Block et al. | 179/113 |
| 3,204,201 | 8/1965 | Bahrs | 330/68 |
| 3,244,960 | 4/1966 | Stevens et al. | 336/84 C |
| 3,458,843 | 7/1969 | Lord | 336/84 C |
| 3,522,509 | 8/1970 | Hasenbalg | 336/84 C |
| 3,549,990 | 12/1970 | Hochheiser | 336/DIG. 2 |
| 3,963,975 | 6/1976 | Gauper, Jr. et al. | 336/84 C |
| 4,030,058 | 6/1977 | Riffe et al. | 336/DIG. 2 |
| 4,236,086 | 11/1980 | Hoebel | 336/DIG. 2 |

Primary Examiner—Harold I. Pitts
Assistant Examiner—Danita R. Byrd
Attorney, Agent, or Firm—Michael J. Striker

[57] ABSTRACT

A corona effect sound emitter including a discharge electrode producing corona discharge and surrounded by a spherical counter electrode is partially inserted in a housing which encloses a high frequency generator, modulation transformer and a power supply transformer of which the power supply transformer supplies the discharge electrode with electric current. A thin plate of a magnetic metal transversally extends in the housing so that secondary windings of the transformers are positioned above the plate and are separated from the primary windings of the transformers disposed below the plate.

12 Claims, 7 Drawing Figures

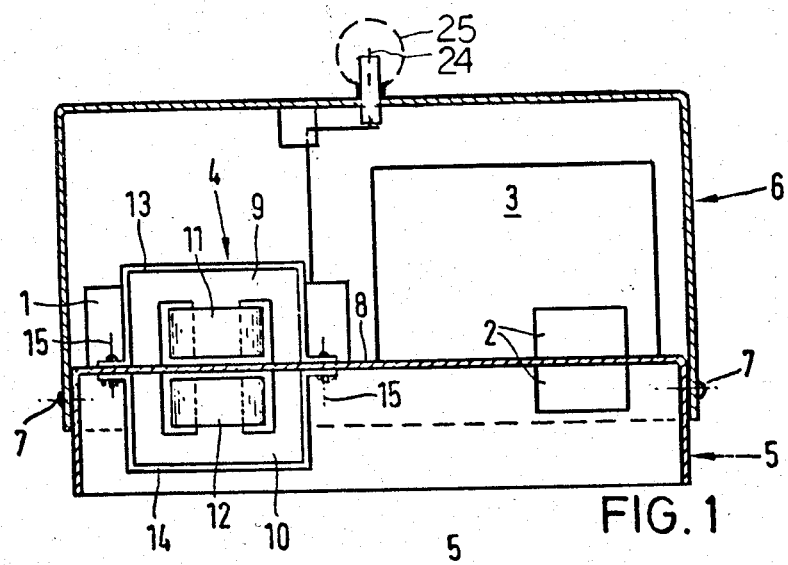
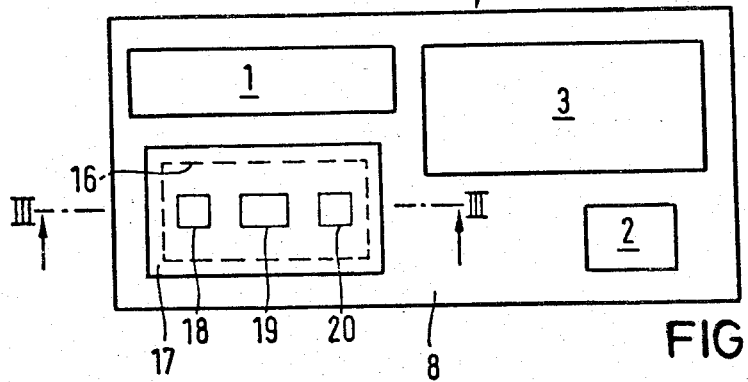
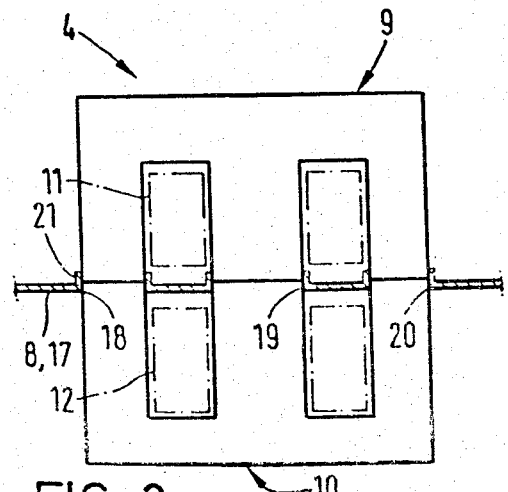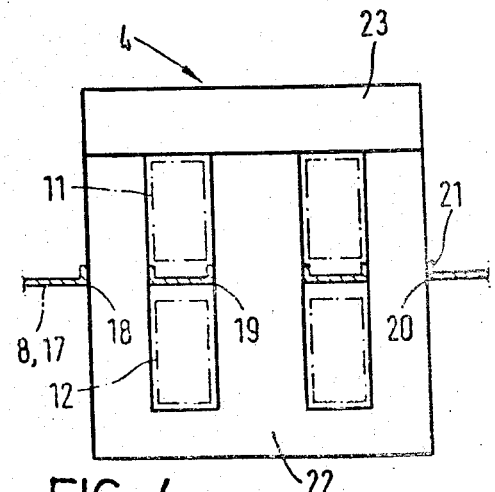

4,464,544

CORONA-EFFECT SOUND EMITTER

CROSS-REFERENCE TO A RELATED APPLICATION

This application is a continuation-in-part of the application Ser. No. 132231 filed Mar. 31, 1980 and now abandoned.

BACKGROUND OF THE INVENTION

The invention relates to a corona-effect sound emitter.

Known sound emitters of the type under consideration normally operate with a modulated corona discharge which generates air pressure fluctuations and usually provide for a tone of remarkable clearness.

Corona-effect sound emitters are disclosed, for example in the French Pat. No. 1,041,790 and U.S. Pat. Nos. 2,768,246 and 3,177,288. The known sound emitters however, although provided with metal shielding can not prevent propagation of electromagnetic waves outside the emitter housing.

The transformer disposed in the vicinity of the high frequency oscillator generates in operation electromagnetic waves, and although the whole device is located inside of the metal shielding to prevent propagation of electromagnetic waves outside the shielding it can happen that electromagnetic waves can leak outside via electrical connecting leads which pass necessarily through the metal shielding. These disturbing electromagnetic waves can be further suppressed by selected self-induction and condensation in electrical leads although this measure can not totally prevent leakage of electromagnetic waves through the electrical leads. If leakage of electromagnetic waves is about 100 microvolts it can totally disturb the function of the household appliance, particularly a television set.

SUMMARY OF THE INVENTION

It is an object of the invention to avoid the disadvantages of known corona-effect sound emitters.

It is a further object of the invention to provide an improved corona-effect sound emitter in which propagation of electromagnetic waves outside of the metallic shielding is totally prevented.

These and other objects of the invention are attained by a corona-effect emitter, comprising a metal housing and a thin metal plate closed therewith; a high frequency oscillator generating in operation disruptive electro-magnetic waves, a modulation transformer, and a power supply transformer mounted on said plate such that said housing with said plate form a Faraday cage; and a needle-shaped discharge electrode having a tip and being electrically connected to said high frequency oscillator and producing corona discharge and a counter electrode spaced from the discharge electrode and surrounding the latter, said counter electrode forming a Faraday cage around said tip, said modulation transformer and said power supply transformer each having a primary winding and a secondary winding, the secondary windings of said power supply transformer and said modulation transformer being respectively positioned inside the housing and above the metal plate and the primary windings of the power supply transformer and the modulation transformer being respectively positioned outside of the housing and below the metal plate so that the metal plate extends between the secondary windings and primary windings of the respective transformers.

Preferably, the thin metal plate extending between the primary and secondary windings of both transformers may be made out of a practically amagnetic metal having high electrical resistivity. Magnetic field of the transformers can penetrate that plate. The metal plate may be formed of stainless steel and have a thickness of less than 0.1 mm.

According to further features of the invention each of the transformers can include an iron circuit divided into two parts, said parts each bearing the respective winding and being separated by said plate so that said parts face towards each other.

Each of those parts may have at least two parallel legs which form, respectively, a core and return circuit for the magnetic flux, the free ends of the legs of one of said parts or iron circuit being in contact with one face of the plate, while the free ends of the legs of the other of said parts are in contact with the opposite face of the metal plate and in the alignment with the legs of the one part.

The plate may be formed with a number of openings equal to the number of legs, each opening having a shape closely matching the profile of the cross section of one of said legs, the legs of one of the parts of the iron circuit passing through the openings and being disposed in end-to-end arrangement with the legs of the other part of the iron circuit.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

FIG. 1 is a side view of a corona-effect sound emitter according to the invention, partially in section;

FIG. 2 is a top plan view of the device illustrated in FIG. 1 but with the metal housing removed;

FIG. 3 is a sectional view along line III—III of FIG. 2;

FIG. 4 is a view corresponding to FIG. 3 but of another embodiment of the invention;

DETAILED DESCRIPTION OF THE PREFERRED EMBODIMENTS

Figure 5:
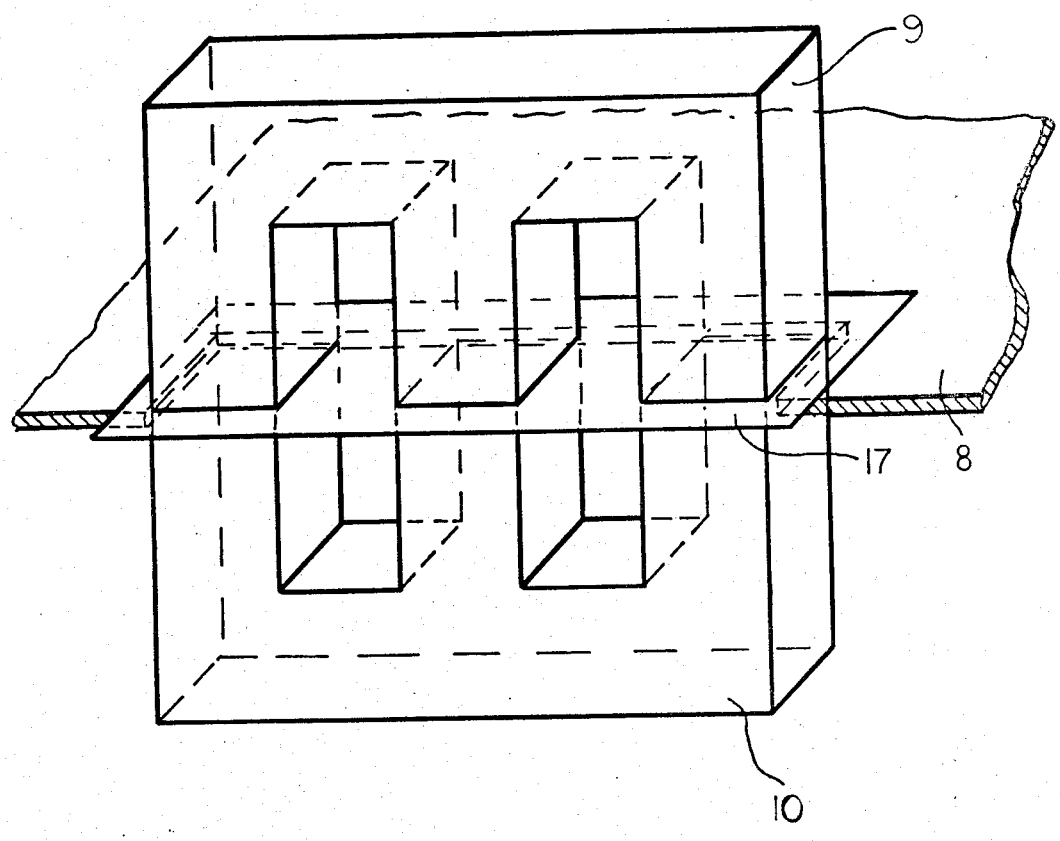
FIG. 5 is a perspective view of a power supply transformer.

Referring now to the drawings, and first to FIGS. 1 and 2 it will be seen that the sound emitter comprises a high-frequency oscillator 1 the output signal of which is modulated by a modulation transformer 2, and a high-frequency transformer 3 which raises the modulated HF signal to an HF potential on the order of several Kilovolts and whose output is connected to a discharge electrode of a corona-effect transducer.

The high-frequency generator or oscillator 1 with the frequency of about 27 mega Hertz supplies high frequency voltage to a needle-shaped discharge electrode 24. The tip of the discharge electrode 24 is surrounded by a spherical grounded counter electrode 25 made out of fine wire net. A strong electrical high frequency field is thus formed between the electrodes 24 and 25. At the tip of the discharge electrode 24 is formed a corona-discharge which results in intensive ionizing of air molecules. This corona discharge causes an overhearing of the space around the tip of the discharge electrode so that the mean temperature at that space may be, for example about 1500° C. which can result in substantial increase in volume of air surrounding this electrode. The above mentioned temperature is directly dependent upon the intensity of corona discharge since it defines the quantity of ionized gas molecules. Therefore, the amplitude modulations in high frequency voltage cause temperature fluctuations about the mean value of 1500° C. These temperature fluctuations cause air pressure fluctuations. Modulation signals are thus transformed in this fashion into acoustic waves.

The voltage required for operation of the high frequency oscillator 1 is generated by the power supply transformer 4 and by rectifier and filter means.

The structure of the corona effect emitter according to the invention includes a metal chassis 5 on which high-frequency oscillator 1, power supply transformer 4, high frequency transformer 3 and modulation transformer 2 are mounted and a metal housing 6 which covers the chassis and the components mounted thereon. The metal housing 6 is releasably connected to chassis 5 by means of screws 7. The metal housing 6 forms together with an upper plate 8 of the chassis a Faraday cage which prevents the propagation into the ambient atmosphere of the electromagnetic waves generated by the high-frequency oscillator 1. The sound emitter operated on the principle of corona effect can be mounted immediately on the housing 6 or partially in the interior of the housing as shown in FIG. 1.

In known arrangements of the art of the invention the molulation transformer 2 and power supply transformer 4 are arranged within a metal shielding. The electric leads which supply low-frequency modulation signal and the line current, respectively to the modulation transformer 2 and to the supply transformer 4 have to pass through that metal shielding. In spite of all precautions which have been taken to prevent the electromagnetic waves generated by oscillator 1 from propagating to the outside through these current supply leads it was not possible, however to prevent leaks of electro-magnetic waves, which, although very minor were sufficient to disturb the operation of the devices, particularly the operation of a television receiver working in the proximity of the sound emitter.

The present invention makes it possible to overcome the problem encountered in the prior art devices of the foregoing type. According to the invention the primary and secondary windings of each of transformers 2 and 4 are separated from each other, respectively by the plate 8 whereby one winding of each transformer is inside of the housing 6 and another winding of each transformer is arranged outside of plate 8. The respective primary and secondary windings, however are coupled magnetically with one another through the plate 8.

Such separation of the windings is disclosed herein in detail in the example of the power supply transformer 4. It should be, however, understood that the windings of the modulation transformer 2 are separated from each other in a similar fashion.

The iron body of the power supply transformer 4 is divided into two portions 9 and 10 of which portion 9 carries a secondary winding 11 and portion 10 carries a primary winding 12. Both portions 9 and 10 of transformer 4 are disposed one against the other on two opposite sides of the upper plate 8 of chassis 5. In such a position portions 9 and 10 are held by means of respective mounting brackets 13 and 14 which are connected to plate 8 by means of screws 15.

Each portion 9, 10 of the iron body of the transformer is formed of a stack of magnet metal sheets cut in the form of an E-shaped element with a central leg forming a magnetic core for a winding 11 or 12 and two lateral legs forming a return circuit for the magnetic flux. Three legs of the upper portion 9 are in contact with the upper face of plate 8 whereas three legs of portion 10 are in contact with the lower face of plate 8.

In order to provide for satisfactory efficiency of transformer 4 plate 8 should not constitute a magnetic shunt between portions 9 and 10. Therefore, plate 8 must be made out of a magnetic material or a material which should be as little magnetic as possible. Furthermore, plate 8 should be as thin as possible. Since the plate 8 surrounding the central legs of the portions 9 and 10 of the magnetic circuit forms a short circuit turn it should be preferably made out of metal with high electrical resistivity in order to limit losses in plate 8 due to Jouleeffect. Plate 8 may be preferably formed of stainless steel. The plate 8 should be as thin as possible and chassis 5, however must have at the same time the mechanical rigidity sufficient to support all the individual components of the emitter. In order to overcome this problem plate 8 as shown in FIG. 2 is formed with a large rectangular opening 16 which is closed by a thin rectangular plate 17. Plate 17 is made out of amagnetic material with high resistivity, for example stainless steel. Plate 17 can be connected to plate 8 by welding or any other suitable means.

FIG. 3 illustrates another possible disposition of two portions 9 and 10 of the magnetic circuit of transformer 4. In this arrangement plate 8 or plate 17, similarly to the embodiment of FIG. 2, is provided with a number of openings equal to the number of legs of portions 9 and 10. Each opening 18, 19, 20 has a shape and size which closely matches the profile of the cross-section of the respective leg of portion 9 or 10. Three legs (in the case of E-shaped configuration of portions 9 and 10) of, for example portion 10 pass through the respective openings so that they are disposed end-to-end with the legs of portion 9. Both portions 9 and 10 are held in assembled position by brackets 13 and 14 or any other suitable means. To insure a perfect seal against propagation of electromagnetic waves outside of the housing a collar-like bent flange 21 is formed on plate 8 and similar flanges are also formed in openings 18, 19 and 20. Collar-like flange 21 is in immediate contact with the metal sheets of the iron magnetic circuit.

FIG. 4 shows still another embodiment of the arrangement of transformer 4. In this embodiment, the iron magnetic circuit of the transformer comprises a part 22 composed of stack of metal sheets of an E-like configuration, whose central leg carries the primary winding 12 and the secondary winding 11, and a part 23 which is formed as a laminated yoke constituting a bar connecting the legs of part 22 to each other. In assembly primary winding 12 is first placed on the central leg of part 22 and then three legs of part 22 slide into openings 18, 19 and 20 of plate 8 in which they are engaged at substantially half their length. Secondary winding 11 is afterwards placed on the central leg of part 22 and then yoke 23 is applied onto the free ends of those three legs. The assembly is held by brackets 13 and 14 in the manner similar to that of FIG. 1.

FIG. 5 shows in a perspective view the separation of windings 11 and 12 of the power supply transformer from each other by a thin plate of stainless steel. The thickness of such plate can be preferably 0.05 mm.

Figure 6:
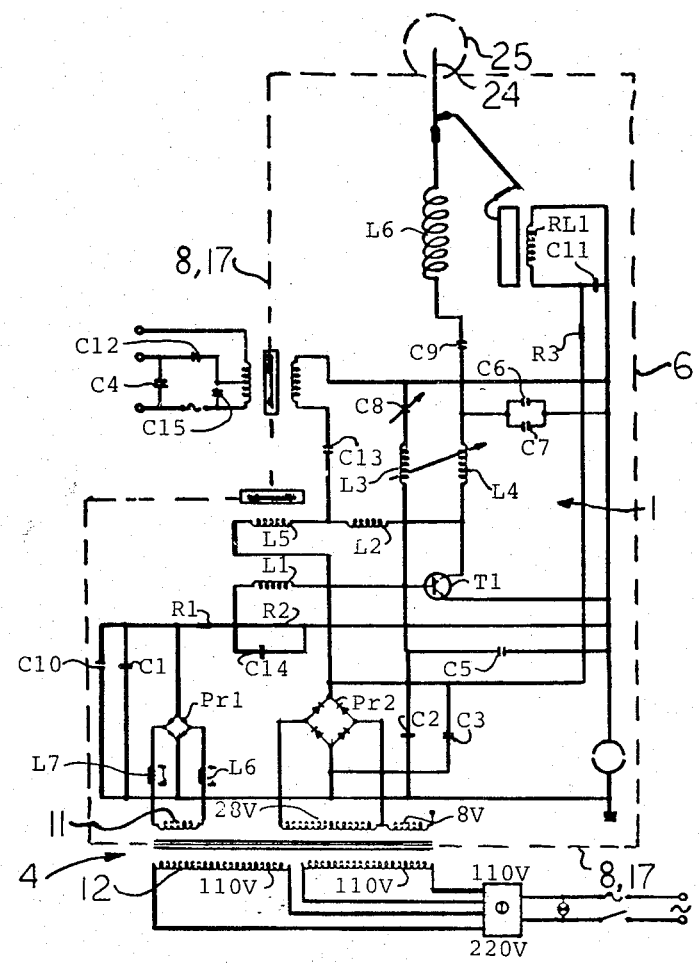
FIG. 6 is a circuit diagram of the corona-effect sound emitter according to the invention.

FIG. 6 illustrates a circuit diagram of the corona-effect emitter wherein electrical connections between high-frequency oscillator 1, power supply transformer 4 and discharge electrode 24 are shown. Dotted lines clearly show as to how respective windings of power supply transformer 4 and modulation transformer 2 are separated from each other by means 8 or 17.

Figure 7:
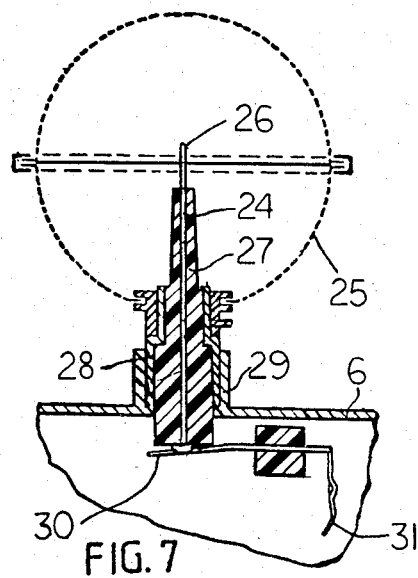
FIG. 7 is a partial sectional view of a discharge electrode and a counter electrode of the corona-effect sound emitter.

FIG. 7 shows a mounting arrangement of discharge electrode 24 on the housing 6. Discharge electrode 24 is embedded in an electrode holder 27 formed of an isolated material which is isolated from the metal housing 6. Tip 26 extends outwardly from the electrode holder 27 and is surrounded with a counter electrode 25 of spherical shape. Counter electrode 25 is made out of electrically conductive and permeable to sound waves laminar material, for example compact metal wire cloth or porous metal-sinter material. The spherical counter electrode 25 is connected to housing 6 by means of a contact sleeve 28, counter electrode forming around discharge electrode 24a Faraday cage. The contact sleeve 28 is inserted into a flange 29 formed on the housing 6 and outwardly extended therefrom so that the lower end of the discharge electrode abuts against a lead 30 connected to the high-frequency generator 1 by a lead 31.

It will be understood that each of the elements described above, or two or more together, may also find a useful application in other types of corona-effect sound emitters differing from the types described above.

While the invention has been illustrated and described as embodied in a corona-effect sound emitter, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A corona-effect emitter, comprising a metal housing and a thin metal plate closed therewith; a high frequency oscillator generating in operation disruptive electro-magnetic waves, a modulation transformer, and a power supply transformer mounted on said plate such that said housing with said plate form a first Faraday cage; and a needle-shaped discharge electrode having a tip and being electrically connected to said high frequency oscillator and producing corona discharge and a counter electrode spaced from the discharge electrode and surrounding the latter, said counter electrode forming a second Faraday cage around said tip, said modulation transformer and said power supply transformer each having a primary winding and a secondary winding, the secondary windings of said power supply transformer and said modulation transformer being respectively positioned inside the first Faraday cage and above said plate, and the primary windings of said power supply transformer and said modulation transformer being respectively positioned outside said first Faraday cage and below said plate so that said metal plate extends between the secondary windings and primary windings of the respective transformers.

2. The emitter as defined in claim 1, wherein said counter electrode is made out of electrically conductive material permeable to sound waves.

3. The emitter as defined in claim 1, wherein said metal plate is a metal foil having a thickness of less than 0.1 mm.

4. The emitter as defined in claim 3, wherein said metal plate is made out of stainless steel.

5. The emitter as defined in claim 1, wherein each of said transformers includes an iron circuit divided into two parts, said parts each bearing the respective winding and being separated by said plate so that said parts face towards each other.

6. The emitter as defined in claim 5, wherein each of said parts has at least two parallel legs which form, respectively, a core and return circuit for the magnetic flux, to free ends of the legs of one of said parts of the iron circuit being in contact with one face of said plate, while the free ends of the legs of the other of said parts are in contact with the opposite face of said plate and in the alignment with the legs of said one part.

7. The emitter as defined in claim 6, wherein said plate is formed with a number of openings equal to the number of legs, each opening having a shape closely matching the profile or the cross section of one of said legs, the legs of one of said parts of the iron circuit passing through said openings and disposed in end-to-end arrangement with the legs of the other part of the iron circuit.

8. The emitter as defined in claim 7, wherein said thin plate is formed with bent collar-like flanges respectively surrounding each of said openings.

9. The emitter as defined in claim 1, further including a metal chassis connected to said housing, said plate forming an upper wall of said chassis, said high frequency oscillator, said modulation transformer and said power supply transformer being rigidly mounted to said chassis.

10. The emitter as defined in claim 9, wherein said plate is formed with at least one rectangular aperture, the emitter further including at least one thin metal foil closing said aperture and separating the secondary winding from the primary winding of the respective transformer.

11. The emitter as defined in claim 1 or 8, wherein said discharge electrode partially surrounded by said counter electrode is mounted on said housing.

12. The emitter as defined in claim 1 or 8, wherein said discharge electrode is partially inserted into said housing.

* * * * *